United States Patent
Ibok

(10) Patent No.: US 6,399,519 B1
(45) Date of Patent: Jun. 4, 2002

(54) METHOD FOR ESTABLISHING ULTRA-THIN GATE INSULATOR HAVING ANNEALED OXIDE AND OXIDIZED NITRIDE

(75) Inventor: Effiong Ibok, Sunnyvale, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/479,505

(22) Filed: Jan. 7, 2000

Related U.S. Application Data

(60) Provisional application No. 60/169,697, filed on Dec. 7, 1999.

(51) Int. Cl.[7] .............................................. H01L 21/31
(52) U.S. Cl. ...................... 438/762; 438/769; 438/770; 438/775; 438/786; 438/287
(58) Field of Search .............................. 438/762, 769, 438/770–777, 786, 787–788, 791–792, 287

(56) References Cited

U.S. PATENT DOCUMENTS

| | | | | |
|---|---|---|---|---|
| 4,436,770 A | * | 3/1984 | Nishizwa et al. | 427/255.3 |
| 5,436,481 A | * | 7/1995 | Egawa et al. | 257/324 |
| 5,683,929 A | * | 11/1997 | Ohi et al. | 438/396 |
| 6,037,651 A | * | 3/2000 | Hasegawa | 257/635 |
| 6,069,041 A | * | 5/2000 | Tanigami et al. | 438/261 |

* cited by examiner

Primary Examiner—Tuan H. Nguyen
Assistant Examiner—Thanh Nguyen
(74) Attorney, Agent, or Firm—LaRiviere, Grubman & Payne, LLP

(57) ABSTRACT

A method for fabricating a semiconductor device including a silicon substrate includes forming a thin Nitrogen Oxide base film on a substrate, and then annealing the substrate in ammonia. An ultra-thin nitride film is deposited on the base film. The semiconductor device is then oxidized in Nitrogen Oxide. FET gates are then conventionally formed over the gate insulator. The resultant gate insulator is electrically insulative without degrading performance with respect to a conventional gate oxide insulator.

8 Claims, 2 Drawing Sheets

METHOD FOR ESTABLISHING ULTRA-THIN GATE INSULATOR HAVING ANNEALED OXIDE AND OXIDIZED NITRIDE

CROSS-REFERENCE TO RELATED APPLICATION

This application claims the benefit of U.S. Provisional Application No. 60/169,697 filed on Dec. 7, 1999 and entitled "METHOD FOR ESTABLISHING ULTRA-THIN GATE INSULATOR HAVING ANNEALED OXIDE AND OXIDE NITRIDE".

TECHNICAL FIELD

The present invention relates to the fabrication of semiconductor devices, and more particularly to establishing field effect transistor (FET) gate insulators.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

It can readily be appreciated that it is important to electrically isolate various components of an integrated circuit from each other, to ensure proper circuit operation. As one example, in a transistor, a gate is formed on a semiconductor substrate, with the gate being insulated from the substrate by a very thin dielectric layer, referred to as the "gate oxide" or "gate insulator". As the scale of semiconductor devices decreases, the thickness of the gate insulator layer likewise decreases.

As recognized herein, at very small scales, the gate insulator can be become so thin that otherwise relatively small encroachments into the gate insulator layer by sub-oxides from the substrate and from adjacent polysilicon connector electrodes can reduce the insulating ability of the gate insulator layer. This poses severe problems because under these circumstances, even very minor defects in the substrate can create electron leakage paths through the gate insulator, leading to catastrophic failure of the transistor.

To circumvent this problem, alternatives to traditional gate oxide materials, such as high-k dielectric materials including nitrides and oxynitrides that can be made very thin and still retain good insulating properties, have been proposed. Unfortunately, it is thought that these materials can degrade the performance of the transistor. Nitride, in particular, has been considered undesirable because it promotes unwanted leakage of electrons through the gate insulator layer.

Furthermore, as the gate insulator layer becomes very thin, e.g., on the order of nineteen Angstroms (19Å), device integration becomes highly complicated. Specifically, it is necessary to etch portions of the polysilicon electrodes down to the substrate, but stopping the etch on a very thin, e.g., 19Å gate insulator layer without pitting the substrate underneath becomes problematic. Accordingly, the present invention recognizes that it is desirable to provide a gate insulator layer that can be made very thin as appropriate for very small-scale transistors while retaining sufficient electrical insulation properties to adequately function as a gate insulator, and while retaining sufficient physical thickness to facilitate device integration, without degrading performance vis-a-vis oxide insulators.

BRIEF SUMMARY OF THE INVENTION

A method for making a semiconductor device includes providing a semiconductor substrate, and establishing an oxide base film on the substrate. The substrate is annealed, preferably in ammonia at temperatures up to eleven hundred degrees Celsius (1100° C.) to reduce the effective thickness of the base film, after which a Nitride film is established over the base film and the substrate oxidized, preferably with the substrate disposed in Nitrogen Oxide at a temperature of 700° C. to 1100° C. for about one minute or longer. FET gates are next formed on portions of the film.

In one preferred embodiment the base film defines a thickness of no more than fifteen Angstroms (15Å), and more preferably the base film defines a thickness of no more than twelve Angstroms (12Å). The preferred Nitride film, on the other hand, has a thickness of between eight Angstroms and fifteen Angstroms (8Å–15Å).

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

Figure 1:
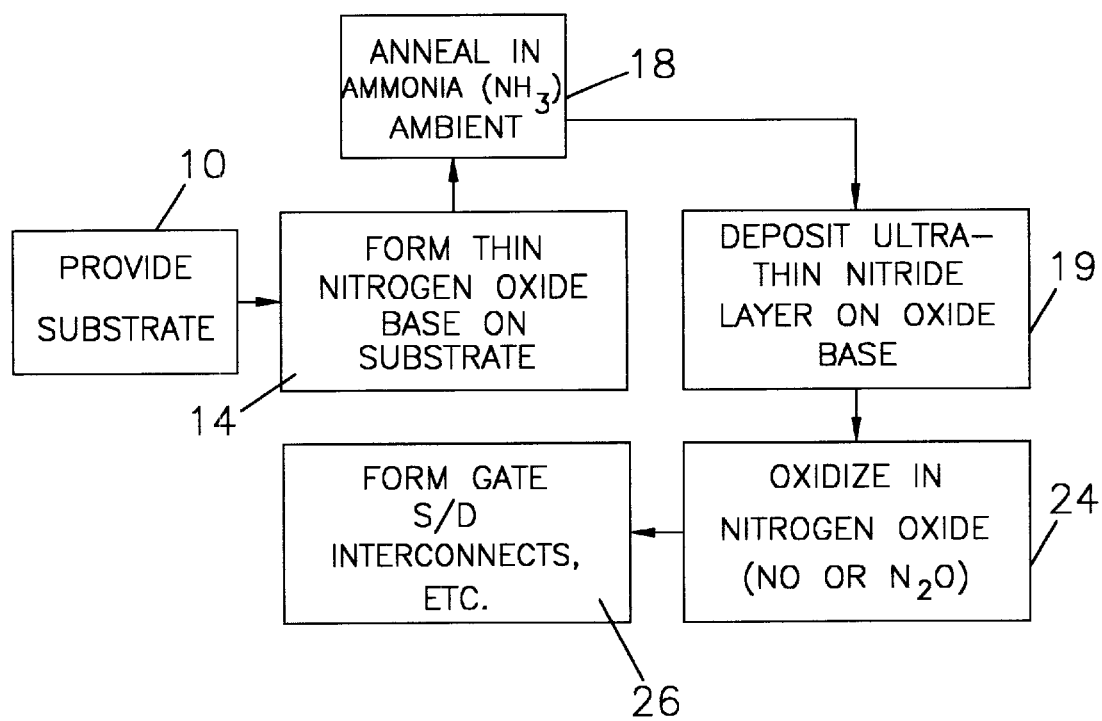
FIG. 1 is a flow chart of the manufacturing process.
Figure 2:
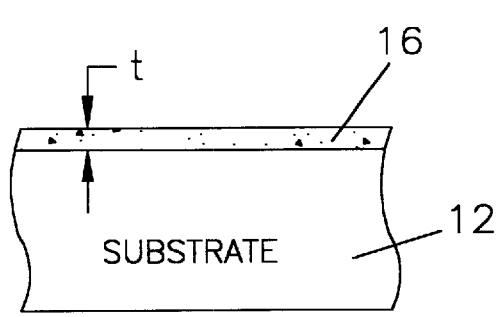
FIG. 2 is a side view of the device after forming the base film on the substrate.

Referring initially to FIGS. 1 and 2, at block 10 in FIG. 1 a semiconductor substrate 12 (FIG. 2) such as Silicon is provided, and then at block 14 a thin Nitrogen Oxide base film 16 is formed on the substrate 12 in accordance with oxide film formation principles known in the art, in direct contact with the substrate 12. The thickness "t" of the base film 16 is no more than fifteen Angstroms (15Å), and more preferably is no more than twelve Angstroms (12Å). In some processes a thin oxide layer about eight Angstroms thick might remain after conventional pre-gate cleaning of the substrate 12, in which case a thin Nitrogen Oxide film would not be deposited, with the thin oxide remainder film establishing the base film of the present invention.

Moving to block 18 of FIG. 1, the substrate 12 with film 16 is annealed in situ in ammonia ($NH_3$) at a temperature of up to eleven hundred degrees Celsius (1100° C.) to raise the Nitrogen concentration in the base film 16. As recognized herein, the anneal passivates the Nitrogen and Silicon free chemical bonds ("dangling bonds") in the base film 16, such that the performance of the present insulator is not degraded vis-a-vis conventional films.

Figure 3:
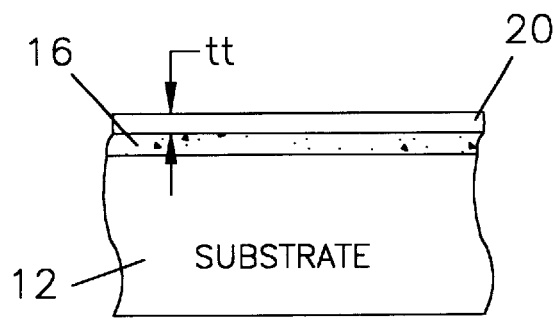
FIG. 3 is a side view of the device after forming the nitride film on the base film.

Next, at block 19 in FIG. 2 and referring now to FIG. 3, an ultra-thin Nitride film 20 is deposited directly onto the base film 16 by, e.g., low pressure chemical vapor deposition (LPCVD) or other appropriate vapor deposition process. The ultra-thin Nitride film 20 has a thickness "tt" of between eight Angstroms and fifteen Angstroms (8Å–15Å). Together, the films 16, 20 establish a gate insulator.

To alleviate the undesirable decrease in electron mobility exhibited by previous nitride-like gate insulators, the process continues to block 24 in FIG. 2, wherein the substrate with film is oxidized in Nitrogen Oxide or Oxygen. The oxidation preferably is undertaken at a temperature of 700° C. to 1100° C. for about one minute or longer. The two heat treatments described above also inhibit Boron penetration during subsequent processing, as well as decreasing film stress, leading to improved dielectric quality.

Figure 4:
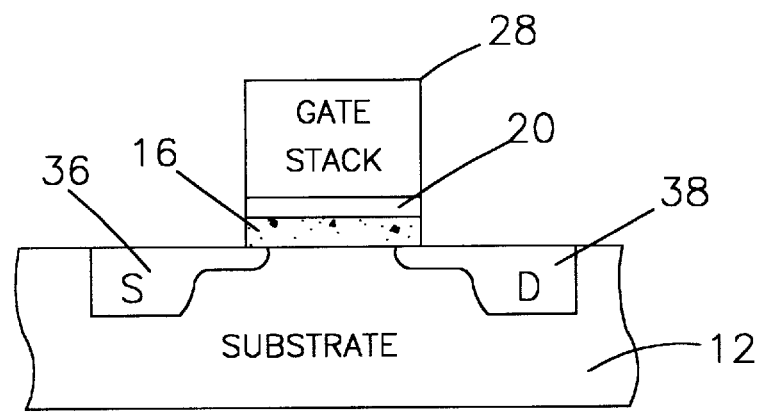
FIG. 4 is a side view of the device after forming the FET gate stacks on the nitride film.

The process moves from block 24 to block 26, wherein a polysilicon-based field effect transistor (FET) stack 28 (FIG. 4) is formed on the nitride film 20 in accordance with FET gate stack deposition and patterning principles known in the art. After forming and patterning the FET stacks 28, the process is completed by forming FET sources and drains 36, 38 using conventional principles, and contacts, interconnects, and FET to FET insulation are likewise conventionally undertaken.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for making a semiconductor device, comprising:

providing a semiconductor substrate;

establishing an oxide base film on the substrate;

annealing the substrate;

After annealing, depositing a Nitride film over the base film using chemical vapor deposition; then oxidizing the substrate; and forming FET gates on portions of the nitride film.

2. The method of claim 1, wherein the act of annealing is undertaken with the substrate disposed in ammonia.

3. The method of claim 1, wherein the oxidizing act is undertaken at a temperature of 700° C. to 1100° C. for about one minute or longer.

4. The method of claim 2, wherein the base film defines a thickness of no more than fifteen Angstroms (15Å).

5. The method of claim 2, wherein the base film defines a thickness of no more than twelve Angstroms (12Å).

6. The method of claim 1, wherein the annealing act is undertaken at temperatures up to eleven hundred degrees Celsius (1100° C.).

7. The method of claim 1, wherein the oxidizing act is undertaken with the substrate disposed in Nitrogen Oxide.

8. The method of claim 1, wherein the Nitride film has a thickness of between eight Angstroms and fifteen Angstroms (8 Å–15Å).

* * * * *